US007936233B2

(12) United States Patent
Vellas et al.

(10) Patent No.: US 7,936,233 B2
(45) Date of Patent: May 3, 2011

(54) COAXIAL AUTOMATIC IMPEDANCE ADAPTOR

(75) Inventors: Nicolas Vellas, Halluin (FR); Christophe Gaquière, Villeneuve-d'Ascq (FR); Frédéric Bue, Lille (FR); Damien Ducatteau, Bondues (FR)

(73) Assignees: Centre National de la Recherche Scientifique - CRNS, Paris (FR); Universite des Sciences et Technologies de Lille - USTL, Villeneuve-d'Ascq (FR)

( * ) Notice: Subject to any disclaimer, the term of this patent is extended or adjusted under 35 U.S.C. 154(b) by 181 days.

(21) Appl. No.: 11/988,953

(22) PCT Filed: Jul. 18, 2006

(86) PCT No.: PCT/FR2006/001759

§ 371 (c)(1), (2), (4) Date: Feb. 25, 2009

(87) PCT Pub. No.: WO2007/010134

PCT Pub. Date: Jan. 25, 2007

(65) Prior Publication Data

US 2009/0146757 A1 Jun. 11, 2009

(30) Foreign Application Priority Data

Jul. 18, 2005 (FR) ..................................... 05 07607

(51) Int. Cl.
*H03H 7/38* (2006.01)

(52) U.S. Cl. .......................... 333/17.3; 333/33; 333/263

(58) Field of Classification Search ................. 333/17.3, 333/33, 263

See application file for complete search history.

(56) References Cited

U.S. PATENT DOCUMENTS

| | | | |
|---|---|---|---|
| 2,403,252 | A | 7/1946 | Wheeler |
| 3,792,385 | A | 2/1974 | Napoli et al. |
| 6,297,649 | B1 | 10/2001 | Tsironis et al. |
| 2003/0122633 | A1 | 7/2003 | Tsironis |

FOREIGN PATENT DOCUMENTS

| | | | |
|---|---|---|---|
| JP | 57-063901 | A | 4/1982 |
| JP | 09-317824 | A | 12/1997 |
| JP | 2004-31678 | A | 11/2004 |

*Primary Examiner* — Stephen E Jones

(74) *Attorney, Agent, or Firm* — Harness, Dickey & Pierce, P.L.C.

(57) ABSTRACT

The invention concerns a coaxial automatic impedance adaptor characterized in that it comprises two slugs and has only a lateral translational movement along an axis Ox. The double slug tuner principle is based on the movement of two line segments of different characteristics of 50 O inside a closed cylinder on either side of standard connectors.

17 Claims, 2 Drawing Sheets

COAXIAL AUTOMATIC IMPEDANCE ADAPTOR

The present invention relates to the field of communication electronics and technology.

The present invention more particularly relates to a coaxial automatic impedance adaptor.

The prior art already knows from the American U.S. Pat. No. 3,792,385 ("RCA"), a coaxial slug magnetic tuner (an impedance adaptor). A movable matching magnetic slug coupled, in a capacitive way, to the central conductor and to the external conductor of an electromagnetic transmission line is used to supply a transmission line impedance in response to the application of a magnetic field.

The prior art also knows from the American U.S. Pat. No. 6,297,649 ("Focus Microwaves"), a coaxial tuner (an impedance adaptor) capable of performing harmonics rejection.

The two main manufacturers of impedance adaptors: "Maury Microwave Corporation" and "Focus Microwaves" (Registered Trademarks) use one or several plunger(s) which move(s) independently from each other along the axes Ox and Oy, as indicated by the arrows in FIG. 1.

The displacement of the plungers along both axes is performed through driven motors.

As for the displacement along the axis Ox, i.e. along the axis of the coaxial line, the whole block (motors+plunger) moves thanks to a guiding axis. A control software makes it possible to avoid collisions between the two blocks since they move on the same guiding axis.

As for the displacement along the axis Oy, i.e. perpendicularly to the axis of the coaxial line, the plunger gets close to or goes away from the central conductor which locally varies the distance between the central line and the plunger, i.e. the characteristic impedance of the line.

When the plunger or plunger(s) is/are as far as possible from the central line (plungers out), the tuner has an impedance equal to 50Ω.

Such coaxial automatic tuners have the major advantage of being able to be calibrated prior to the measuring of the components. The input and the output of the tuner are connected to vector network analyzer. For several hundreds of positions, a control software of the vector network analyzer and of the tuner makes it possible to acquire tuner dispersion parameters for several frequencies. Upon completion of the tuner calibration, it is possible to characterize a component very rapidly as regards power and/or noise without any mounting or dismounting of the measuring system.

Coaxial tuners have excellent performances, but the latter are quickly reduced by the tuner insertion losses related to the transition between the coaxial connector and the central conductor. The greater the transmission losses, the weaker the module of the reflection factor of the load impedance obtained. Consequently, it will not be possible to synthesize all the impedances of Smith diagram.

It should be noted that there are "dead zones" on a Smith diagram: the zone between the "edge" of the Smith diagram and the impedance circle for a given frequency is called "a dead zone". The impedances existing in this zone cannot be obtained for the given frequency.

Coaxial tuners have the advantage of having a broad band and to allow for the passage of continuous voltages, but the insertions losses reduce their performances at a high frequency.

Such tuners are also very bulky and heavy which is an important disadvantage when the components are directly measured on a "wafer" using microwave probes. As a matter of fact, given the size of the tuner, the latter is connected to the component by a means of a cable having losses. The distance between the tuner and the component is increased and the insertion losses between the tuner and so are the component. Under such conditions, the dead zone is more important. In order to reduce such zone, a pre-matching system is positioned between the probe and the tuner. However, such device does not make it possible to completely eliminate the above-mentioned limitation. Besides, such pre-matching is very rigid. This significantly increases the vibrations, in the plane of the microwave probes, induced by the displacement of blocks.

As already mentioned, such tuners have a translation movement of blocks along the axis Ox. The rapid displacement of such blocks (carriage+motor+plunger), the weight of which is important, causes important inertia movements and thus vibrations. Now, when measuring with probes, such vibrations quickly deteriorate the quality of the contacts between the probes and the component and thus the quality of the measurement. When the component is being tested, such effect can entail the destruction of the latter and more particularly of the probes, especially if the component is polarized at a high voltage.

Impedance matching hand-operated tuners are also known from the patents U.S. Pat. No. 2,403,252 and U.S. Pat. No. 3,792,385, the adjustment operation of which is extremely tedious, more particularly because of the use of screws to be unscrewed in order to displace a matching element.

From the documents U.S. Pat. No. 6,297,649 and US-2003/0122633, impedance adaptors are also known, which include two modules of the plunger type, such as described hereabove. Such plungers are protruding elements which take place on a generally high part of the transmission line. Such plungers fill the space of the transmission line in an uneven way and can cause load charges. Besides, the dissymmetry caused by such plungers is not favorable to the utilization of the adaptor on an inclined plane.

The solutions described in these two documents as well as the solution described in the document JP-57063901 are based on the utilization of mobile carriages fitted with motors. A problem mentioned hereabove then remains: the vibrations caused by the operation of the motors are likely of affect the slugs inside the transmission line or to make any microwave measurement with probes ineffective.

The present invention is intended to remedy such disadvantages of the prior art, by providing a double slug coaxial tuner. This new impedance adaptor best answers the characterization of power and noise transistors. Such tuner is provided to be operated on broad frequency bands and has only a side translational movement along the axis Ox.

For this purpose, in its broadest sense, the present invention relates to a coaxial impedance adaptor comprising two slugs and has only one side translational movement along the axis Ox.

According to one embodiment, this concerns a coaxial impedance adaptor for a transmission line comprising in the longitudinal direction a conductive central line having an axis Ox, the adaptor comprising two slugs in the transmission line capable of moving along a translational movement along the axis Ox and two motors, each driving into translation, one of said slugs, said motors being insulated from the slugs by means of elastic couplings. This gives both an efficient device to scan all the impedances on the Smith diagram and a stable adaptor as regards the vibrations caused by the motors.

Advantageously, said impedance adaptor is operated in the band of frequency from 0.25 GHz to 240 GHz.

According to one embodiment, said slugs have a circular section and slide longitudinally in the transmission line. They are particularly well-suited for circular section transmission guides. In the case where such guides have a rectangular section or a section of any other shape, slugs having an identical section will preferably be chosen, so as to "fill" the wave guide zone.

"Resonator" slugs comprising a stack of metallic layers separated by at least one insulating layer in the longitudinal direction or "wide band" slugs composed of metallic cylinders, the sides faces of which have a recession centered towards the inside of the cylinder are preferred, depending on the desired applications. By modifying the combinations of slugs, thanks to their exchangeability, an increased efficiency in the recovery of the impedances of the Smith diagram can be obtained, while avoiding load leakages or any other microwave interference.

In order to avoid short-circuits, A dielectric is deposited on the central line of the impedance adaptor or on the slugs (external and internal diameter). This is aimed at limiting short-circuits and improving microwaves performances.

Advantageously, the slugs are exchangeable.

It should be noted that the motors are insulated from the rest of the system by means of elastic couplings in order to minimize vibrations.

According to one aspect, the principle of the double slug tuner is based on the displacement of two line segments having a characteristic impedance different from 50Ω inside a cylinder closed at both ends by standard connectors.

According to a second aspect, the principle of such tuner is based on the displacement of two slugs having a characteristic impedance different from 50Ω in a 50Ω coaxial line.

Therefore, it is generally chosen that said slugs have characteristic impedance different from the characteristic impedance of said transmission line which amounts to 50Ω in many wave guides.

Advantageously, the first slug locally reduces the impedance of the line by varying the value of diameter D of the external conductor.

An automatic driving, for example by means of computer and/or electronic means is provided for the slugs, so as to allow a precise and reproducible positioning of the latter. For this purpose, each slug is made integral with a carriage by means of an elastic coupling, the adaptor comprising in addition motors capable of driving the carriages into a translation in the longitudinal direction of the transmission line. The motors are then automatically driven.

Said motors can be linear, step by step, or piezoelectric motors, and the carriages are mounted on guides parallel to the transmission line and driven by the motors.

According to an alternative embodiment, each motor is a rotating motor which rotates a corrected precision screw driving into translation a corresponding carriage which an associated slug is connected to.

Advantageously, said motors are optimized in order to have short displacement times, as well as precise control of acceleration and servo-control profiles. During the operation, one of the slugs, also called a pre-matching slug, is so arranged as to move on a distance of $\lambda/2$, where $\lambda$ is the working wavelength, and the second slug is so arranged as to move on a distance of $\lambda/2$ with respect to said pre-matching slug.

According to one embodiment, the impedance adaptor has a reflection factor greater than 0.98 at 10 GHz.

The advantages of the coaxial automatic tuner according to the present invention are as follows:

- Microwave performances which are much better than the existing systems. As a matter of fact, according to the present invention, the system has a very flexible impedance synthesis at a high reflection factor.

- The frequency band that can be obtained for coaxial tuners extends from of 0.25 GHz to 240 GHz.
- It is possible to easily exchange the slugs for specific applications in order to adapt the performances of the tuner with respect to the studied components.
- The provided system provides a very high repeatability at a high reflection factor.
- Only one movement along the transmission line exists whereas in the existing systems, two movements exist, one of which is perpendicular to the transmission line (with movements very close to such line).
- A high robustness with respect to the existing systems. In conventional systems, the movable slug must get close to the suspended central line (at a few dozens of μm) and this on a long distance. This causes an important breakability. In our system, this problem is totally solved. The tuner can even be operated on an inclined plane without any efficiency loss. Besides, the deposition of the dielectric makes it possible to improve the performances and avoid short-circuits.
- The system provided is much more stable (as regards vibrations) than the conventional system. As a matter of fact, the motors are insulated from the rest of the system by means of elastic couplings.

This is a very important point when measurements are carried out with probes.

- Very light weight of the slug which does not induce a problem of a mobile gravity centre.
- The system holding the slugs (replacing the plunger system of the conventional systems) makes a precise positioning as well as a very good repeatability possible.
- The motors and the associated electronics have been optimized in order to have short displacement times, as well as a precise control of accelerations and servo-controls profiles (in order to minimize the problem of vibrations).
- Under such conditions, the cost of manufacturing is much lower than the existing systems.
- There is no modification of the center of gravity thanks to the positioning of motors insulated from the slugs and the light weight of the system.
- The system according to the invention gives the central line a high robustness. As a matter of fact, the latter is kept at a constant distance: there is no suspended line like in the tuners of the prior art. The transport of the tuner according to the invention is not a problem.
- The tuner according to the invention can bear high polarization voltages thanks to the design of the tuner.

The invention will be better understood when reading the following description which is given only as an explanation, of an embodiment of the invention, while referring to the appended drawings.

The principle of such tuner is based on the movement of two slugs having a characteristic impedance different from 50Ω in a coaxial line of 50Ω. The characteristic impedances of coaxial slugs are given by the relation (1) hereinunder. Such impedance adaptor is shown in FIG. 2.

$$Z_c = \frac{138}{\sqrt{\varepsilon_r}} \log_{10}\left(\frac{d_2}{d_1}\right) \quad (1)$$

where $\in_r$ is the dielectric constant of the medium.

Figure 1:
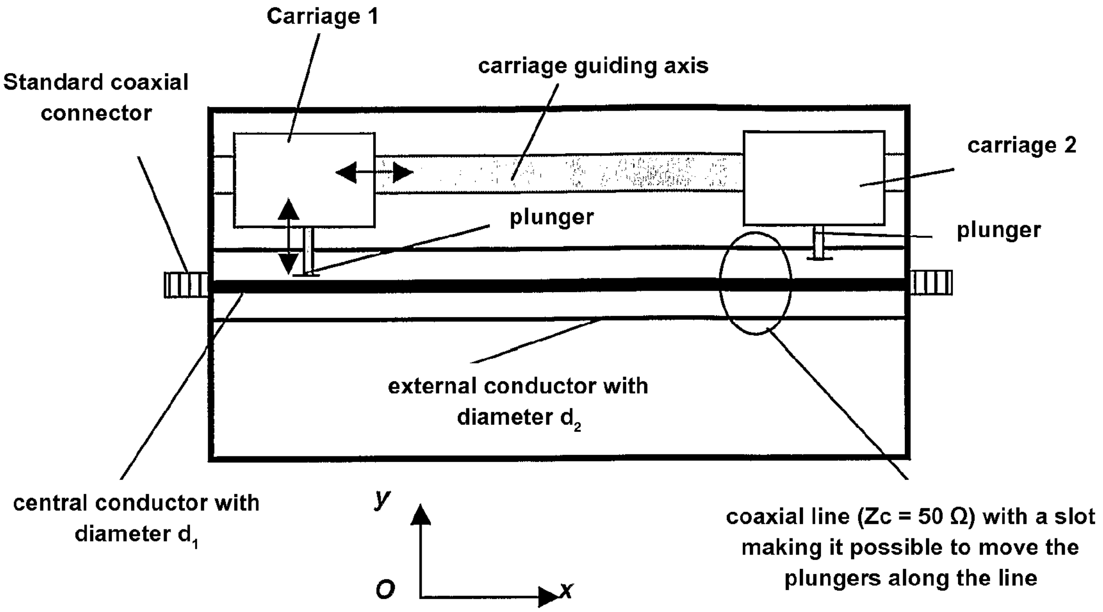
Figure 1 Prior Art
FIG. 1 illustrates an exemplary impedance adaptor according to the prior art.
Figure 2:
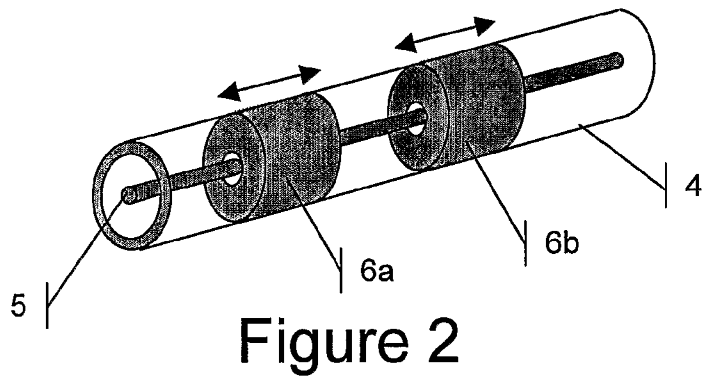
FIG. 2 illustrates an exemplary arrangement of slugs in an impedance adaptor according to the present invention.

FIG. 2 shows the transmission line 4 having a cylindrical shape, comprising in the longitudinal direction and in its center a conductive central line 5. The transmission line 4 has a diameter of 6.91 mm and the central line 5 a diameter of 3 mm. The thus made "transmission line+central line" assembly has a characteristic impedance of 50Ω.

The slugs 6*a* and 6*b* have a cylindrical form, are 3.75 mm in length and have an external diameter which is slightly smaller than the internal diameter of the transmission line, i.e. approximately 6.9 mm. They have a longitudinal bore in the center diameter 3.1 mm, which makes it possible for the central line 5 to go through. The slug can thus easily slide along the central line (refer to the arrows in FIG. 2). Each slug has a characteristic impedance which is significantly different from that of the transmission line, which means that, with the above mentioned dimensions, the impedance of the slugs is approximately 2 ohms.

Figure 4:
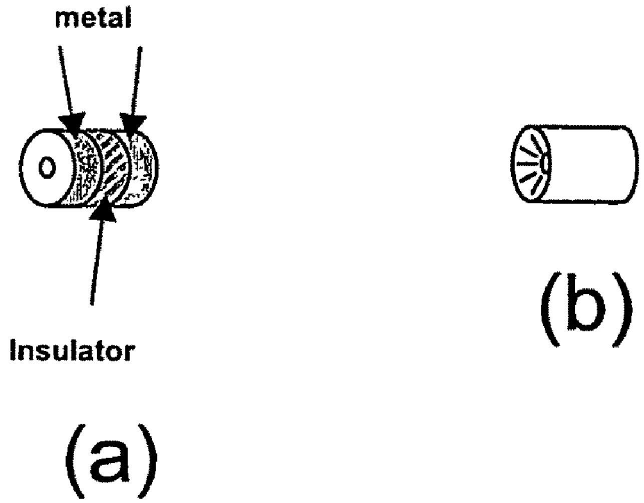
FIG. 4 shows two exemplary exchangeable slugs used in the present invention.

FIG. 4 illustrates two exemplary slugs which can be used in pairs. The slug of FIG. 4*a* is a "resonator" slug of a cylindrical shape and composed, in the longitudinal direction, of two metallic layers separated by an insulator layer. Such arrangement reduces the frequency band such that the slug behaves like a resonator. The advantage of the reduction in the frequency band for which the slug is operated is in the possibility to control the value of the reflection factor imposed on the component being tested, not only for one frequency, but for several frequencies.

The slug of FIG. 4*b* is made of metal and has a cylindrical shape, having at both end faces, a progressive recession from the outside towards the center where the conducting central line 5 slides. Such recession has the effect of increasing the slug frequency band. The latter thus acts as a broad band slug.

Any other shape of the transmission line 4 (for example having square or rectangular section) can also be appropriate as long as the slugs used have substantially the same section as the transmission line and comply at best with the inner shape of such transmission line, with the exception of the conductive central line 5 on which the slugs slide.

The slug locally varies the impedance of the line by modifying the value of the diameter D of the external conductor. Such local variation of impedance changes the reflection factor of the tuner and thus the impedance thereof.

If the slug 6*b* slides on the impedance line $Z_c$, the impedance of the tuner moves on a constant voltage standing-wave ratio circle centered on $Z_c$. A displacement by λ/2 (where λ represents the working wavelength) makes it possible to describe the whole circle on Smith diagram. According to the characteristics of the slug (internal diameter and length), the radius of the circle on Smith diagram varies. Then, it is impossible to cover the whole diagram with only one slug having non-adaptable characteristics. Then, a second slug 6*a* is added in front of the first one. This will make it possible to carry out a pre-matching: displacing the center of the circle described.

The tuner impedance then no longer moves on a constant voltage standing-wave ratio circle. If the first slug 6*b* is moved by a distance λ/2 along the conductor, the whole circle on the diagram is described around the pre-matching impedance.

If the position of the second slug is varied, the center of the described circle moves on a constant voltage standing wave ratio circle. Moving on a distance of λ/2 with the second slug, and for each position thereof, scanning a distance of λ/2 with the first one, makes it possible to draw a multiple circle which make it possible to cover the whole of Smith diagram.

The characteristics of the circles drawn (radius, constant voltage standing wave ratio circle, on which the center moves) depend on the characteristics of the slugs used. Thus, for example, a combination of slugs will make it possible to get several points on the edge of the diagram, whereas another combination will make it possible to have a better coverage of the diagram. This gives an additional flexibility of use.

The manufactured adaptor has been given an automatic operation by using two step-by-step motors having a very high precision, and associated to an encoding system to perform the displacement of slugs. The motors rotate, each, a corrected precision screw which drives a carriage. Each carriage mounted on a screw drives the movement of a slug.

The tuner could be placed closest to the component being tested, while not affecting the size of the dead zone. As for the commercially available tuners, the automatic calibration of the tuner makes it possible to characterize a component in a few minutes and in very accurate way.

Figure 3:
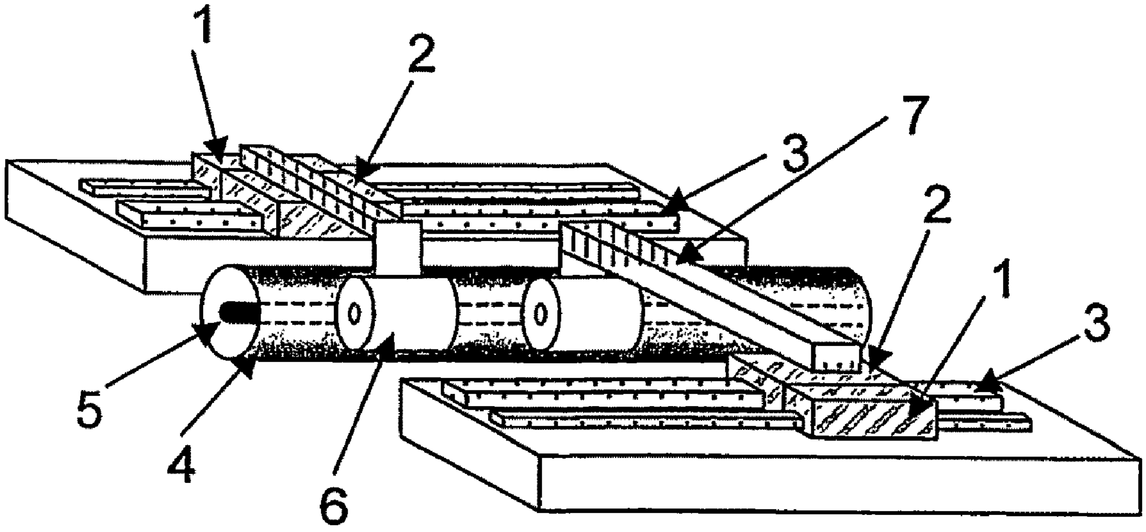
FIG. 3 illustrates the operation of an impedance adaptor according to the invention.

While referring to FIG. 3, an embodiment of the impedance adaptor is provided. It includes:

An internal conductor of diameter $d_1$ (5) and an external conductor of diameter $d_2$ (4), the assembly making a line of transmission as well as two slugs 6*a* and 6*b*. Such assembly is similar to that described while referring to FIG. 2;

A standard coaxial connector (not shown) on each side of the transmission line;

A carriage (2) equipped with a motor (1) making it possible to slide along a guide (3). A motor (1) is of the linear type which makes it possible to limit the vibrations caused during its operation, contrary to rotating motors. The slugs 6*a* and 6*b* are, each, connected to a "carriage 2+motor 1+guide 3" block by a means of a coupling arm 7 provided with vibration damping elastic means. The damping of vibrations is obtained at the coupling arm using a tag of a flexible material interposed between the two metallic parts respectively located towards the "motor+carriage+guide" block and towards the slug.

In order to allow the movement of the slugs 6 by the connection arms 7, the external conductor 4 of the transmission line is provided with a slot in the longitudinal direction of the line.

The invention claimed is:

1. A coaxial impedance adaptor for a transmission line comprising:

in the longitudinal direction, a conductive central line having an axis Ox;

two slugs in the transmission line capable of moving along a translational movement along the axis Ox; and two motors, each driving into translation one of said slugs, said motors being insulated from the slugs by elastic couplings;

wherein said slugs have a circular section and slide longitudinally in said transmission line; and wherein said slugs comprise a stack of metallic layers separated by at least one insulating layer in the longitudinal direction.

2. A coaxial impedance adaptor according to claim 1, wherein a dielectric is deposited on said conductive central line.

3. A coaxial impedance adaptor according to claim 1, wherein a dielectric is deposited on one of internal and external diameters of said slugs.

4. A coaxial impedance adaptor according to claim 1, wherein said slugs have a characteristic impedance different from a characteristic impedance of said transmission line.

5. A coaxial impedance adaptor according to claim 1, wherein said transmission line has a characteristic impedance of 50 ohms.

6. A coaxial impedance adaptor according to claim 1, wherein one of said slugs, so called a pre-matching slug, is so arranged as to move on a distance of λ/2, where λ is a working wavelength and said second slug is so arranged as to move on a distance of λ/2 with respect to said pre-matching slug.

7. A coaxial impedance adaptor according to claim 1, wherein it has a reflection factor greater than 0.98 for 10 GHz.

8. A coaxial impedance adaptor according to claim 1, wherein one of said slugs, so called a pre-matching slug, is so arranged as to move on a distance of λ/2, where λ is a working wavelength and said second slug is so arranged as to move on a distance of λ/2 with respect to said pre-matching slug.

9. A coaxial impedance adaptor according to claim 1, wherein each slug is made integral with a carriage by said elastic coupling, the adaptor further comprising motors capable of driving into translation carriages in said longitudinal direction of said transmission line.

10. A coaxial impedance adaptor according to claim 9, wherein said motors are linear motors and said carriages are mounted on guides parallel to said transmission line.

11. A coaxial impedance adaptor, for a transmission line comprising:

in the longitudinal direction, a conductive central line having an axis Ox;

two slugs in the transmission line capable of moving along a translational movement along the axis Ox; and two motors, each driving into translation one of said slugs, said motors being insulated from the slugs by elastic couplings;

wherein said slugs have a circular section and slide longitudinally in said transmission line; and wherein said slugs are metallic cylinders, the side faces of which have a recession centered towards an inside of said the cylinder.

12. A coaxial impedance adaptor according to claim 11, wherein a dielectric is deposited on said conductive central line.

13. A coaxial impedance adaptor according to claim 11, wherein a dielectric is deposited on one of internal and external diameters of said slugs.

14. A coaxial impedance adaptor according to claim 11, wherein said slugs have a characteristic impedance different from a characteristic impedance of said transmission line.

15. A coaxial impedance adaptor according to claim 11, wherein said transmission line has a characteristic impedance of 50 ohms.

16. A coaxial impedance adaptor according to claim 11, wherein each slug is made integral with a carriage by said elastic coupling, an adaptor further comprising motors capable of driving into translation carriages in said longitudinal direction of said transmission line.

17. A coaxial impedance adaptor according to claim 16, wherein said motors are linear motors and said carriages are mounted on guides parallel to said transmission line.

* * * * *